Aug. 20, 1957 C. HANNIGSBERG 2,803,712
TRANSISTOR AMPLIFIER
Filed May 26, 1956
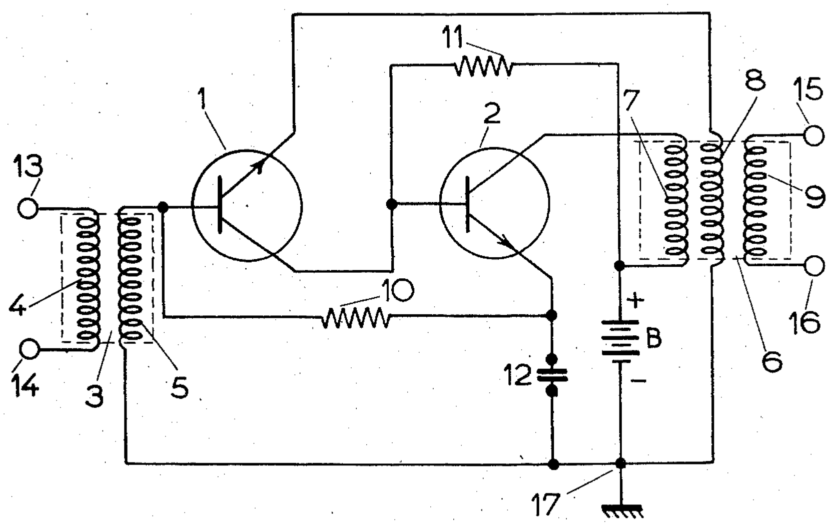

United States Patent Office 2,803,712

Patented Aug. 20, 1957

2,803,712

TRANSISTOR AMPLIFIER

Claude Hannigsberg, Vernouillet, France, assignor to Lignes Telegraphiques & Telephoniques, Paris, France Application March 26, 1956, Serial No. 573,918

Claims priority, application France May 3, 1955

3 Claims. (Cl. 179—171)

The present invention relates to a two-stage transistor amplifier, and more particularly to one which consists of a small number of elements used for its construction.

The principal object of the invention is to provide an amplifier which, in addition to the two transistors themselves, an input transformer and an output transformer, the amplifier comprises only one capacitor and two resistors.

According to the present invention there is provided a two-stage amplifier comprising a first and a second transistor each having a base electrode, an emitter electrode and a collector electrode, an input transformer with a first winding and a second winding, a direct current power supply source, an output transformer with a first winding, a second winding and a third winding, input means for an alternating signal voltage to be amplified connected to said first winding of said input transformer, means connecting the second winding of this same input transformer, on the one hand to a first terminal of said direct current source and on the other hand to the base electrode of said first transistor, a first resistor connecting said electrode with said first terminal of said direct current source through a capacitor offering a low impedance at the frequencies of the signals to be amplified, a first direct connection between the collector of said first transistor and the base electrode of said second transistor, a second direct connection between the emitter of said second transistor and a point common to said first resistor and said capacitor, a second resistor connecting said base electrode of said second transistor with the second terminal of said direct current source, means connecting, through said first winding of said output transformer, the collector of said second transistor to said second terminal of said direct current source, means connecting, through said second winding of said output transformer, the emitter of said first transistor with said first terminal of said direct current source, and means connecting said third winding of said output transformer with a load circuit receiving the amplified signals.

A further object of the present invention is to provide an amplifier having the same properties, some of which are even improved, as the amplifier disclosed in my Patent Application Ser. No. 522,005 filed July 14, 1955, and entitled Amplifier.

Its general properties are the following:

(1) The replacement of the transistors may be effected without any need for modification of the other elements and with no gain variation, owing to a high rate of negative feedback.

(2) Ambient temperature variations have but a negligible effect on the gain and on the maximum output power thanks to the direct connection existing between the two transistors and to the mutual compensation of the current variations of the two stages.

(3) The harmonic distortion is decreased, owing to the high rate of negative feedback.

(4) The power supply voltage and the power drawn are close to the minimum theoretical values.

(5) The efficiency, i. e. the ratio between the power supplied by the direct current power supply source and the alternating current power delivered per output stage, is about 90% of its maximum theoretical value.

(6) The only capacitor in the setup is a decoupling capacitor operating at a voltage lower than 5 volts; it may thus be of a "subminiature" electrolytic type; the tolerances acceptable on the values of the only two resistors in the setup are larger than or equal to 10%, the powers dissipated therein are less than 5 milliwatts. Thus the resistors can also be of the subminiature type. These arrangements lead to the result that the overall dimensions of the amplifier are practically determined by the size of the transformers.

The invention will now be explained in greater detail with reference to the appended drawing which shows, diagrammatically, an amplifier according to the invention.

The amplifier represented in the single figure of the drawing comprises two transistors 1 and 2, an input transformer 3 with two windings 4 and 5, and an output transformer 6 with three winding 7, 8 and 9. The signal to be amplified is applied to the terminals 13, 14 of the winding 4 of the input transformer 3 and the load circuit receiving the amplified signal is connected with the terminals 15, 16 of the winding 9, of the output transformer 6.

The winding 5 of the input transformer 3 has one of its ends connected to a point 17, called "ground" hereinafter, but which may be any other point at a constant potential connected with the negative terminal of a power supply source B, and the other end connected to the base electrode of the transistor 1. The collector of this transistor 1 is connected to one end of the winding 7 of the output transformer 6 through a resistor 11. The base electrode of the transistor 1 is connected to the emitter of the transistor 2 through a resistor 10.

The collector of the transistor 1 is energized from the power supply source B through the resistor 11; the emitter of said transistor 1 is connected to ground at 17 through the winding 8 of the output transformer 6 and its base electrode is suitably biassed by means of the resistor 10 and the direct current resistance of the winding 5 of the transformer 3, the current of the emitter of the transistor 2 flowing through these two resistances.

The collector of the transistor 2 is energized from the source B through the winding 7 of the output transformer 6, while the emitter of this transistor is connected to ground at 17 through the resistance 10 and the winding 5 of the transfomer 3. Between this emitter of the transistor 2 and ground at 17, a decoupling condenser 12 is inserted offering a low impedance to alternating signal currents, and this impedance should not be higher than a few tens of ohms at the lowest working frequencies. The base electrode of the transistor 2 is suitably biassed by means of resistor 11 through which the current through the collector of the transistor 1 flows.

A part of the alternating output voltage of the amplifier, picked off by the winding 8 of the transformer 6, is applied between ground at 17 and the emitter of the transistor 1 with the phase required for obtaining a negative feedback. With a high value for the rate of negative feedback, the gain of the amplifier is determined by the ratio of the number of turns of the windings 8 and 7 of the transformer 6 and no longer depends, practically, on the values of the other elements or on the parameters of the transistor. Under these conditions, the stability of the gain is ensured and, in addition, the gain is not affected by a change or replacement of the transistors, even if they are replaced by transistors having slightly different characteristics.

A method for obtaining the mutual stabilizing of the two stages of the amplifier when the temperature varies and the calculation of the circuit elements have been described in detail in the above mentioned patent application.

In the amplifier which is an object of the present invention, the circuits have been simplified, but the stabilization process remains the same and is summed up hereinafter, the description being given for the case of junction transistors of the NPN type. For the case of PNP type transistors, all of the polarities indicated would have to be reversed.

A temperature rise has a tendency to cause an increase of the collector and emitter currents of the transistors and a decrease of the collector-base electrode voltage, when the power supply source has a constant voltage.

With increasing temperature, the potential with respect to ground of the emitter of the transistor 2 in the second stage has a tendency to increase, since the emitter current of transistor 2, which has increased in value, flows through the resistor 10 and the winding 5 of transformer 3. The potential with respect to ground of the base electrode of transistor 1 also increases and since, from a direct current point of view, the emitter of this transistor is practically grounded through the negligible resistance of the winding 8 of the transformer 6, hence at a substantially fixed potential, the emitter current and consequently the collector current of this transistor 1 increase. The voltage drop through the resistor 11 becomes larger and the potential of the base electrode of the transformer 2 decreases. The potential difference between the base electrode and the emitter of the transistor 2 decreases, which tends to decrease the emitter current and consequently the collector current of the latter, an effect which is opposed to the increase due to the temperature rise.

Taking into account the characteristics of the transistors, it is possible to calculate, by a similar method to that described in the above mentioned patent application, the values of resistor 10, of resistor 11 and of the resistance of the winding 5 of the transformer 3 for the collector current of the second stage to remain constant when the temperature varies. Some limitations due to specific cases of ultilization may determine the parameters of one element, which makes it possible to calculate the others and to determine the power supply voltage.

A few of these limitations may, for instance, be as follows:

The resistor 10, which is practically the load impedance should be low as compared with the impedance this winding is delivering.

The resistor 10, which is practicaly the load impedance for the winding 5 should not exceed a certain value if the voltage of the power supply source is fixed. Its value, practically of the order of a few thousand ohms, depends among other things on the type of transistor used.

The resistor 11 should have a high value as compared with the input impedance of the transistor 2 of the second stage. Its value, which depends on the type of transistor used, is of the order of 50,000 to 150,000 ohms.

It is interesting to note that because the biasing circuit for the base electrode of the transistor 1 is taken at the terminals of the decoupling capacitor 12, the power supply noises fed back by this circuit to the base electrode of the transistor 1 are smaller than if this biasing circuit were taken between the positive terminal of the power supply source and ground, unless an additional de-coupling has been provided for the latter case.

What is claimed is:

1. A two-stage amplifier comprising first and second transistors each having a base electrode, an emitter electrode and a collector electrode, an input transformer with a first winding and a second winding, a direct current power supply source, an output transformer with a first winding, a second winding and a third winding, input means for an alternating signal voltage to be amplified connected to said first winding of said input transformer, means connecting the second winding of this same input transformer, on the one hand to a first terminal of said direct current source and on the other hand to the base electrode of said first transistor, a first resistor connecting said electrode with said first terminal of said direct current source through a capacitor offering a low impedance at the frequencies of the signals to be amplified, a first direct connection between the collector of said first transistor and the base electrode of said second transistor, a second direct connection between the emitter of said second transistor and a point common to said first resistor and said capacitor, a second resistor connecting said base electrode of said second transistor with the second terminal of said direct current source, means connecting, through said first winding of said output transformer, the collector of said second transistor to said second terminal of said direct current source, means connecting, through said second winding of said output transformer, the emitter of said first transistor with said first terminal of said direct currrent source, and means connecting said third winding of said output transformer with a load circuit receiving the amplified signals.

2. An amplifier as claimed in claim 1, wherein both said transistors are PNP junction transistors.

3. An amplifier as claimed in claim 1, wherein said capacitor is a small size low voltage electrolytic capacitor.

No references cited.